United States Patent
Ito

(10) Patent No.: US 8,625,077 B2
(45) Date of Patent: Jan. 7, 2014

(54) POSITIONING APPARATUS, EXPOSURE APPARATUS, AND DEVICE MANUFACTURING METHOD

(75) Inventor: Hirohito Ito, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 454 days.

(21) Appl. No.: 12/984,516

(22) Filed: Jan. 4, 2011

(65) Prior Publication Data
US 2011/0164230 A1 Jul. 7, 2011

(30) Foreign Application Priority Data
Jan. 6, 2010 (JP) ................. 2010-001197

(51) Int. Cl.
*G03B 27/58* (2006.01)
*G03B 27/62* (2006.01)

(52) U.S. Cl.
USPC ............................................. 355/72; 355/75

(58) Field of Classification Search
USPC .............. 355/53, 72, 75; 310/12.06
See application file for complete search history.

(56) References Cited

U.S. PATENT DOCUMENTS

| 7,742,149 B2 | 6/2010 | De Vos et al. | |
|---|---|---|---|
| 2003/0147062 A1* | 8/2003 | Morisada | 355/72 |
| 2008/0212054 A1* | 9/2008 | Kamidi et al. | 355/53 |

FOREIGN PATENT DOCUMENTS

| JP | 07-139582 A | 5/1995 |
|---|---|---|
| JP | 2004-162745 A | 6/2004 |
| JP | 2005-150615 A | 6/2005 |
| JP | 2008-219001 A | 9/2008 |
| JP | 2008-300828 A | 12/2008 |

* cited by examiner

*Primary Examiner* — Peter B Kim
(74) *Attorney, Agent, or Firm* — Canon U.S.A., Inc. IP Division

(57) ABSTRACT

A positioning apparatus according to the present invention includes: a tabletop having a plane; a plurality of actuators configured to be driven in a direction perpendicular to the plane to move the tabletop; and a control unit configured to measure a frequency response of the tabletop and, when a peak is detected at the resonance frequency of elastic vibration of the tabletop, adjust the thrust distribution ratio for the plurality of actuators to reduce the peak.

20 Claims, 9 Drawing Sheets

TOP VIEW

PERSPECTIVE VIEW
FROM OBLIQUELY BELOW

FIG. 3
TORSIONAL MODE
(1ST ORDER)
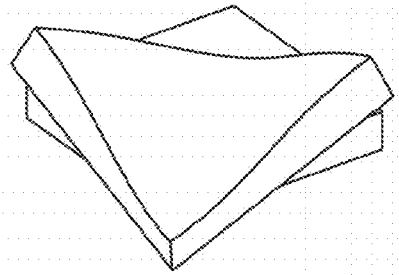
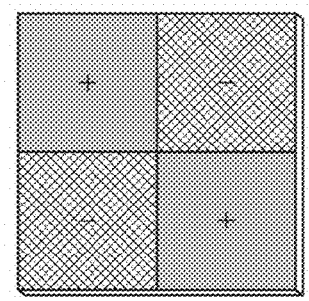
CURVATURE MODE
(2ND ORDER)
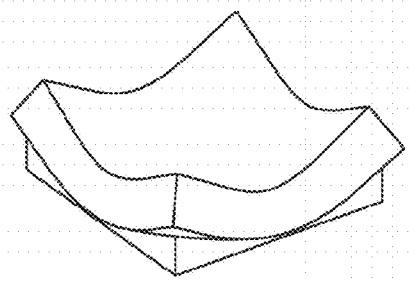
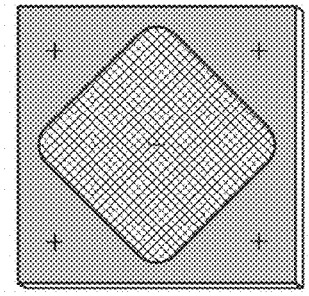
BENDING MODE
(3RD ORDER)
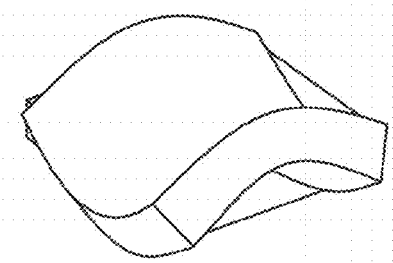
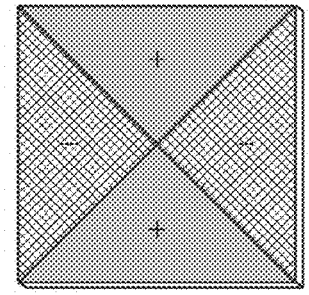

OPEN-LOOP FREQUENCY
RESPONSE

MODE

OPEN-LOOP FREQUENCY
RESPONSE AFTER ADJUSTMENT

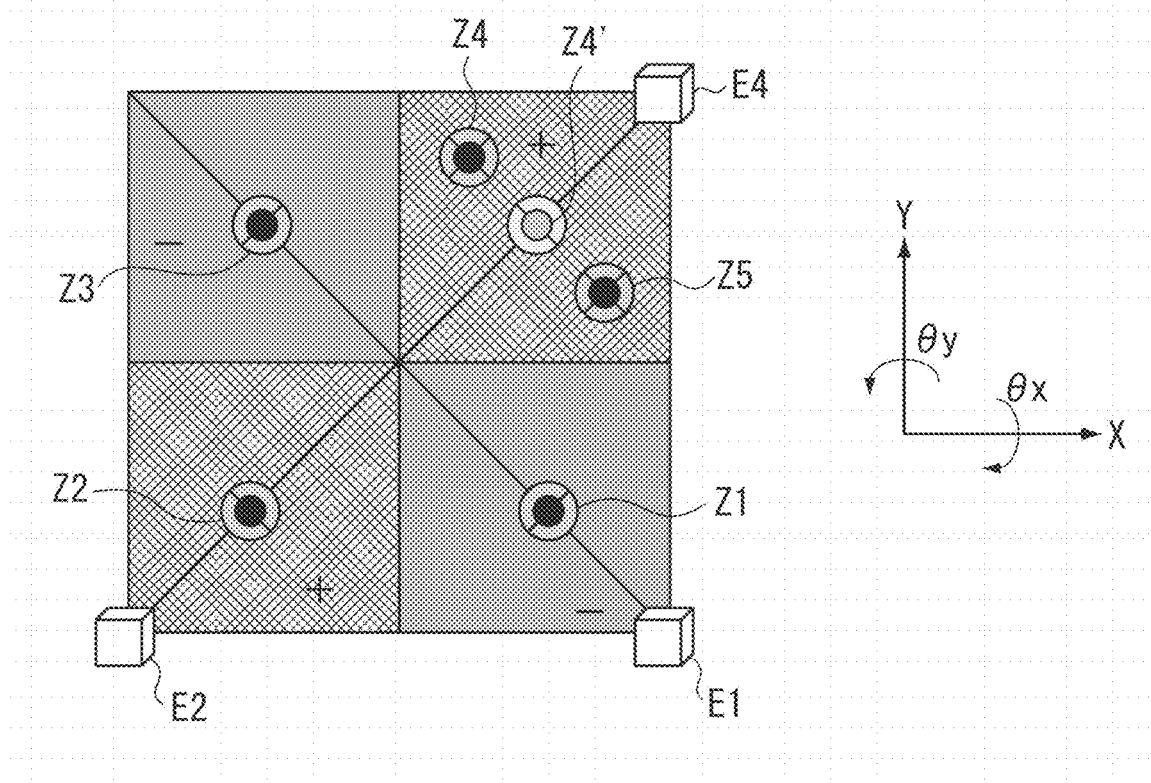

TOP VIEW

MODE

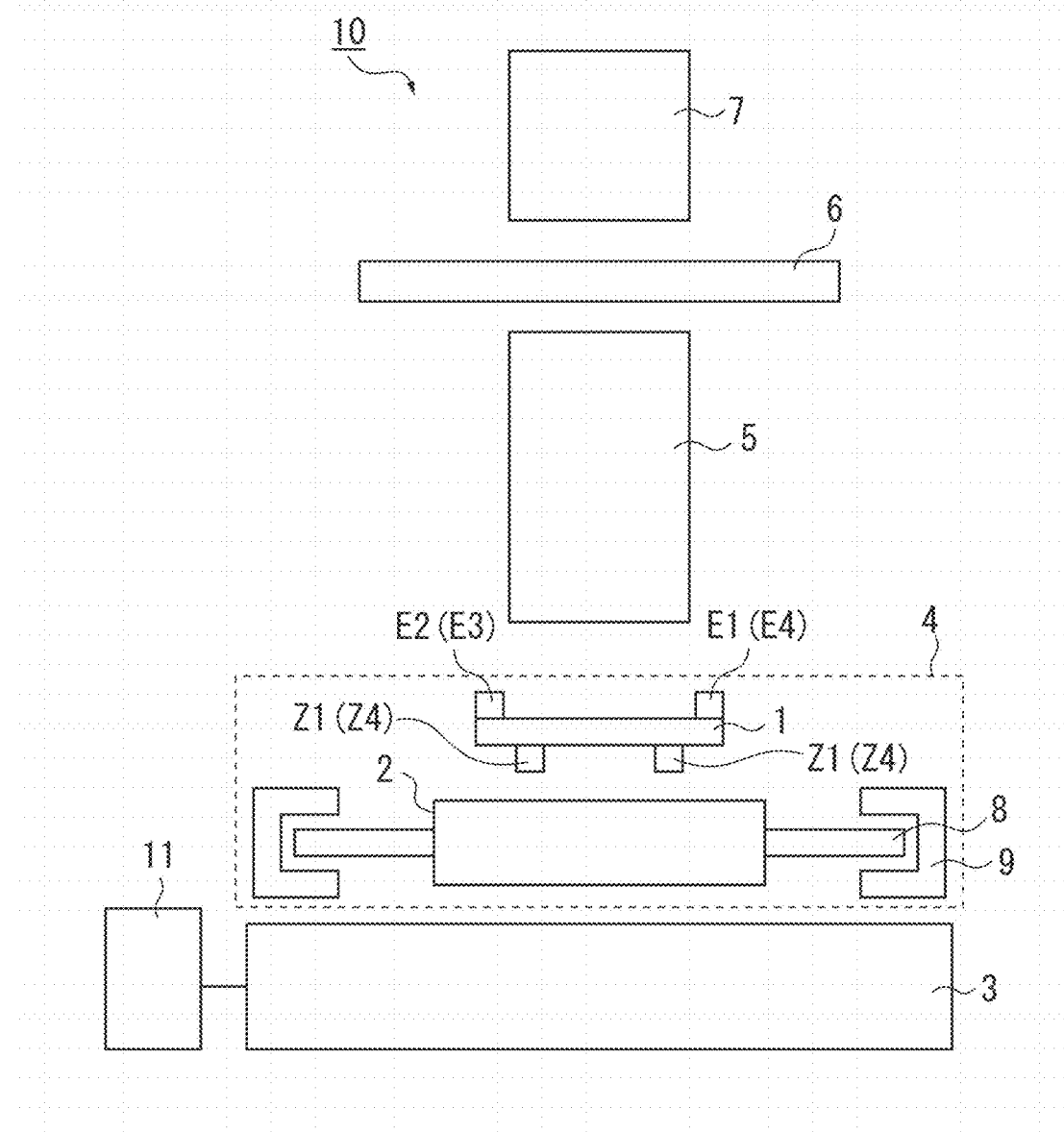

POSITIONING APPARATUS, EXPOSURE APPARATUS, AND DEVICE MANUFACTURING METHOD

BACKGROUND OF THE INVENTION

1. Field of the Invention

The present invention relates to a positioning apparatus installed on a semiconductor exposure apparatus, a liquid crystal exposure apparatus, a measuring apparatus, and a processing apparatus.

2. Description of the Related Art

A wafer stage and a reticle stage used for the exposure apparatus requires high positioning accuracy to correctly transfer microscopic circuit patterns. Therefore, a stage position control system requires a high control band.

The stage position control system also requires high acceleration and high-speed movement to improve the productivity. Although an actuator having a large thrust is used to meet the above-mentioned requirements, the use of such an actuator may increase heat generation therein, possibly resulting in degradation in positioning accuracy. Accordingly, weight reduction of the stages is to be done to reduce the required thrust. However, since weight reduction of the stages decreases an eigenvalue of the elastic vibration mode of the stage structure, gain and phase margins of the position control system decrease and oscillation of the elastic vibration mode becomes likely to occur, thus making it difficult to improve the control band.

Japanese Patent Application Laid-Open No. 2005-150615 discusses a stage configuration for achieving a high control band by using a stage having a low eigenvalue. With this configuration, Z actuators are arranged at nodes of the elastic vibration mode of the stage or at positions where vibrations are mutually negated, resulting in distribution of the thrust. Thus, a high control band can be achieved without being affected by low-order elastic vibration modes.

Japanese Patent Application Laid-Open No. 2008-300828 also discusses a configuration for distributing the thrust to four Z actuators not to cause excitation of the first-order torsional mode. With the conventional techniques, the arrangement of actuators and the thrust distribution ratio for each actuator are determined on the assumption that the deformation shape of the elastic vibration mode is known. Although the deformation shape of the elastic vibration mode can be obtained by using finite element method (FEM) simulation, the deformation shape obtained by the simulation does not completely agree with the deformation shape measured on a real apparatus, resulting in an error. There is also an error in actuator arrangement between design values and the real apparatus because of a manufacture error. Therefore, even when the actuator arrangement and the thrust distribution ratio are determined based on a simulation result or design values, there maybe a situation that the effect of the elastic vibration mode cannot be effectively reduced.

Meanwhile, modal analysis is one of techniques for measuring the deformation shape of the elastic vibration mode of a real apparatus, with which vibration excited by an impact hammer is measured by an accelerometer. This technique requires time and effort and provides a low measurement accuracy making it difficult to accurately measure the deformation shape at actuator positions. Therefore, improving the measurement accuracy is difficult even when the thrust distribution ratio is determined based on the deformation shape measured on the real apparatus. The conventional techniques have not discussed a method for adjusting thrust distribution on the real apparatus when the deformation shape cannot be correctly obtained. Since there has been no choice other than manually repeating trial and error, the conventional techniques require time and effort but do not guarantee the improvement in performance as a result of thrust distribution adjustment.

SUMMARY OF THE INVENTION

The present invention is directed to reducing the effect of the elastic vibration mode in a real apparatus even when there is an error in deformation shape of the elastic vibration mode or an error in actuator arrangement.

A positioning apparatus according to the present invention includes: a tabletop having a plane; a plurality of actuators configured to be driven in a direction perpendicular to the plane to move the tabletop; and a control unit configured to measure a frequency response of the tabletop and, when a peak is detected in a resonance frequency of elastic vibration of the tabletop, adjust the thrust distribution ratio for the plurality of actuators to reduce the peak.

A method, in a positioning apparatus including a tabletop having a plane, and a plurality of actuators configured to be driven in a direction perpendicular to the plane to move the tabletop, for adjusting the thrust distribution ratio for the plurality of actuators includes: measuring a frequency response of the tabletop; confirming whether a peak is detected at the resonance frequency of elastic vibration of the tabletop in the measurement; and adjusting, when the peak is detected, the thrust distribution ratio for the plurality of actuators to reduce the peak.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIG. 3 illustrates exemplary shapes of the elastic vibration mode of the stage.

FIG. 6 illustrates a method for adjusting thrust distribution by using five actuators.

FIG. 9 illustrates an overall configuration of an exposure apparatus.

DESCRIPTION OF THE EMBODIMENTS

Various exemplary embodiments, features, and aspects of the invention will be described in detail below with reference to the drawings.

Figure 1A:
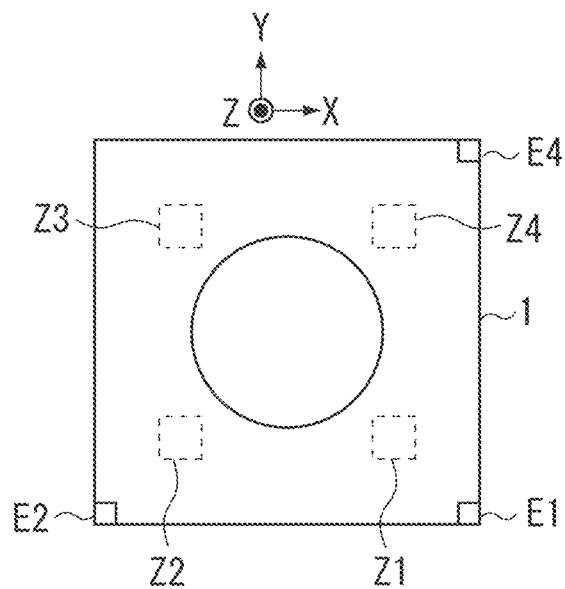
FIGS. 1A and 1B illustrate an overall configuration of a stage according to a first exemplary embodiment.
Figure 1B:
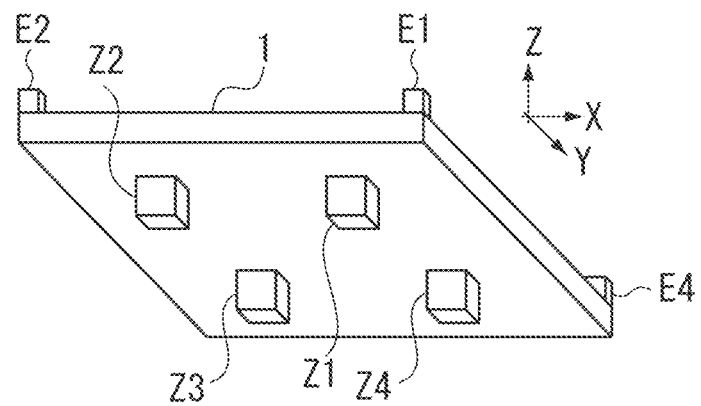
Figure 2:
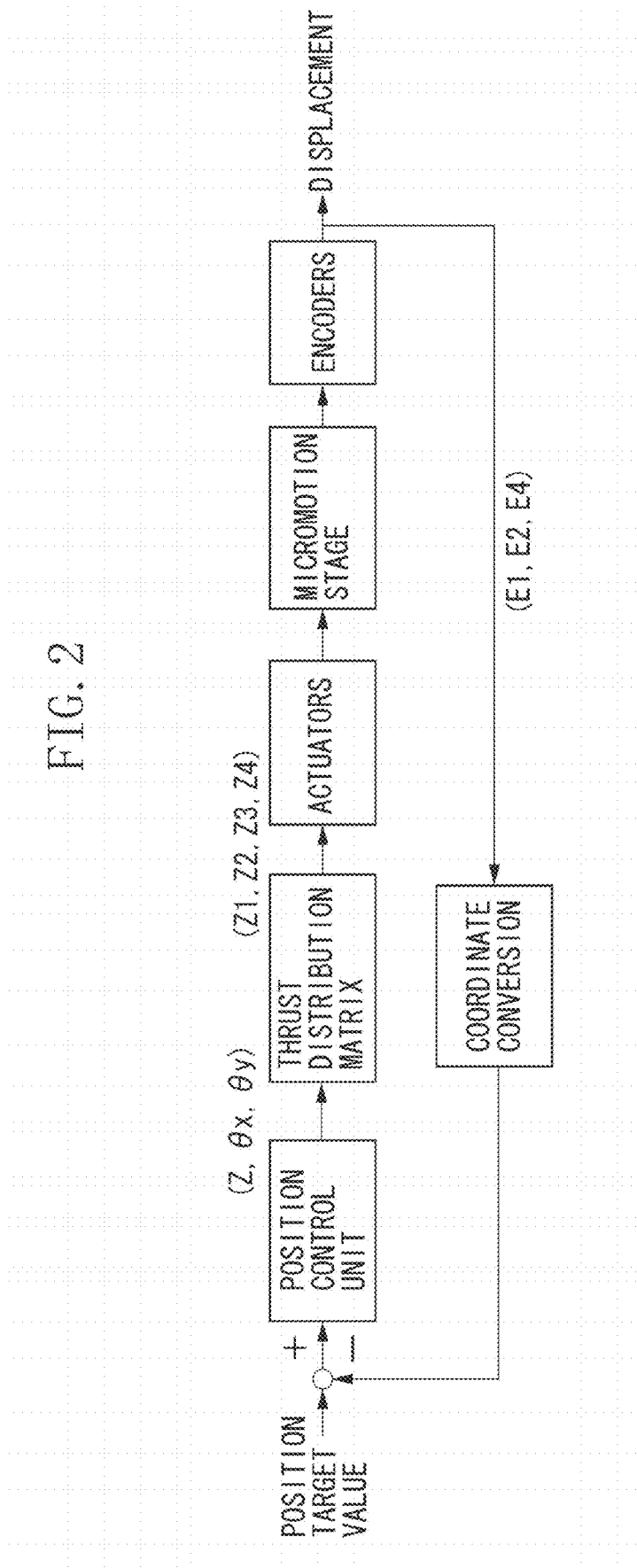
FIG. 2 is a block diagram of a stage control system.

FIGS. 1A and 1B illustrate an overall configuration of a stage according to a first exemplary embodiment. FIG. 2 is a block diagram of a stage control system. Although this block diagram illustrates only the Z, θx, and θy axes, the control system of a real apparatus also includes the X, Y, and θz axes. θx, θy, and θz denote rotation around the X, Y, and Z axes, respectively.

A stage tabletop 1 serves as a stage (a positioning apparatus) on which a workpiece is placed. The stage tabletop 1 is a flat plate having an approximate square shape and a hollow structure for weight reduction. The stage tabletop 1 is composed of, for example, an upper and lower plates connected with ribs or beams. To measure the stage position, the stage is provided with encoders E1, E2, and E4 for measuring the displacement in the Z-axis direction at three out of four corners of the stage. Measurement values of the encoders E1, E2, and E4 are, by predetermined coordinate conversion, converted to Z, θx, and θy displacements of the stage. Four or more encoders may be provided and selected according to the stage position. For position measurement, a mirror for reflecting a beam of a laser interferometer may be provided at the outer peripheral portion of the stage.

The tabletop 1 is provided with a plurality of actuators for driving the stage in six degrees of freedom. From the viewpoint of reduction in vibration transfer, each actuator provided on the tabletop 1 may be a non-contact actuator such as a linear motor or an electromagnet. For example, referring to FIG. 1B, four actuators Z1, Z2, Z3, and Z4 are installed to move the stage in directions of three axes (Z, θx, and θy). In this case, each of the four actuators Z1, Z2, Z3, and Z4 is vertically driven to move the stage tabletop 1 in directions of three axes (Z, θx, and θy).

A position control unit generates a command for each axis based on a difference between each of Z, θx, θy displacements after coordinate conversion, and a target position. The command generated for each axis is distributed as the thrust to each of the Z actuators Z1, Z2, Z3, and Z4 by a thrust distribution matrix.

FIG. 3 illustrates exemplary deformation shapes of the elastic vibration mode of the tabletop 1 having a square flat shape. The torsional mode is a shape with which one pair of diagonal peaks moves up and the other pair of diagonal peaks moves down. A plate having a square flat shape regularly generates the torsional mode as the first-order vibration mode having the lowest inherent frequency. Nodes of the torsional mode coincide with straight lines connecting the centers of opposing sides. The second-order curvature mode is a shape with which the center of the tabletop 1 moves up (or moves down) and the four corners move down (or move up). Nodes of the second-order curvature mode form a lozenge having rounded corners. The third-order bending mode is a shape with which the four corners hardly move up or down, the centers of two opposing sides move down, and the centers of the other two opposing sides move up. Nodes of the third-order bending mode coincide with the diagonal lines. The order of the mode shape and eigenvalue may be interchanged depending on the tabletop design.

Each of the four Z actuators Z1, Z2, Z3, and Z4 is arranged not on a node of the torsional mode but in each of four areas formed by the two nodes extending in first and second directions and intersecting with each other. In this case, the four Z actuators Z1, Z2, Z3, and Z4 are arranged approximately on the two diagonal lines of the stage tabletop 1. Appropriately distributing the thrust to the four Z actuators can prevent excitation of the torsional mode. In this case, arranging the four Z actuators on intersecting points of the node of the curvature mode and the nodes of the bending mode can prevent excitation of the two modes. Arranging the four Z actuators in this way can suppress the effect of the low-order elastic vibration modes which largely affect the control performance. Therefore, this arrangement prevents degradation in control performance even if the eigenvalue (resonance frequency) of the elastic vibration mode decreases by weight reduction. With the fourth-order and higher order elastic vibration modes, a resonance peak can be prevented by using a notch filter or a low-pass filter because of a comparatively high frequency. In this case, the control performance is affected by elastic vibration modes only slightly.

Formula (1) represents a relation between the thrust generated by each of the Z actuators Z1, Z2, Z3, and Z4, the thrust-torque of the rigid-body Z, θx, and θy axes in the mode coordinate system, and the exciting force of a torsional mode m1 in the mode coordinate system.

$$\begin{pmatrix} z \\ \theta_x \\ \theta_y \\ m_1 \end{pmatrix} = \begin{pmatrix} 1 & 1 & 1 & 1 \\ l_{y1} & l_{y1} & l_{y3} & l_{y4} \\ l_{x1} & l_{x2} & l_{x3} & l_{x4} \\ \phi_1 & \phi_2 & \phi_3 & \phi_4 \end{pmatrix} \cdot \begin{pmatrix} z_1 \\ z_2 \\ z_3 \\ z_4 \end{pmatrix} = M \cdot \begin{pmatrix} z_1 \\ z_2 \\ z_3 \\ z_4 \end{pmatrix} \quad (1)$$

The element lxn (n=1 to 4) denotes the distance in the X-axis direction between the actuator Zn and the center of gravity of the stage tabletop 1, and lyn denotes the distance in the Y-axis direction between the actuator Zn and the center of gravity of the stage tabletop 1. φn is a modal parameter for the torsional mode at the position of the actuator Zn. φn is a coefficient for the degree of excitation of the torsional mode by the thrust of the actuator Zn and represents the deformation displacement (mode shape) at the position of the actuator Zn. The elements lxn and lyn can be obtained from design values, and φn can be obtained by FEM simulation.

An inverse matrix of a matrix M, inv(M), serves as a thrust distribution matrix for distributing the thrust to the Z actuators corresponding to the rZ, rθx, and rθy command inputs (for the Z, θx, and θy axes, respectively). The value of each element of inv(M) represents a thrust distribution ratio. For example, m(z1/z) represents the thrust distribution ratio for the actuator Z1 corresponding to the Z-axis command input.

$$\begin{pmatrix} z_1 \\ z_2 \\ z_3 \\ z_4 \end{pmatrix} = inv(M) \cdot \begin{pmatrix} rz \\ r\theta_x \\ r\theta_y \\ rm_1 \end{pmatrix} \quad (2)$$

$$= \begin{pmatrix} m_{(z_1/z)} & m_{(z_1/\theta_x)} & m_{(z_1/\theta_y)} & m_{(z_1/m_1)} \\ m_{(z_2/z)} & m_{(z_2/\theta_x)} & m_{(z_2/\theta_y)} & m_{(z_2/m_1)} \\ m_{(z_3/z)} & m_{(z_3/\theta_x)} & m_{(z_3/\theta_y)} & m_{(z_3/m_1)} \\ m_{(z_4/z)} & m_{(z_4/\theta_x)} & m_{(z_4/\theta_y)} & m_{(z_4/m_1)} \end{pmatrix} \cdot \begin{pmatrix} rz \\ r\theta_x \\ r\theta_y \\ rm_1 \end{pmatrix}$$

Since the product of the matrices M and inv(M) produces a unit matrix (formula (3)), the Z-, θx-, θy-, and m1-axis command inputs act only on respective axes. Further, since the rm1 command input for the torsional mode is zero, the torsional mode is not excited depending on the thrust of the actuators Z1, Z2, Z3, and Z4 distributed by the thrust distribution matrix.

$$\begin{pmatrix} z \\ \theta_x \\ \theta_y \\ m_1 \end{pmatrix} = M \cdot inv(M) \cdot \begin{pmatrix} rz \\ r\theta_x \\ r\theta_y \\ rm_1 \end{pmatrix} = \begin{pmatrix} 1 & 0 & 0 & 0 \\ 0 & 1 & 0 & 0 \\ 0 & 0 & 1 & 0 \\ 0 & 0 & 0 & 1 \end{pmatrix} \cdot \begin{pmatrix} rz \\ r\theta_x \\ r\theta_y \\ rm_1 \end{pmatrix} \quad (3)$$

However, an error arises between design values and FEM simulation, and the real apparatus. Specifically, when the matrix M of the real apparatus is a matrix Mr, the matrix M based on design values and FEM simulation does not completely agree with the matrix Mr of the real apparatus. Therefore, the product of the matrices Mr and inv(M) does not produce a unit matrix as represented by formula (3) but contains non-zero values (*) as non-main diagonal elements as represented by formula (3'). Therefore, distributing the Z-, θx-, and θy-axis command through inv(M) will cause excitation of the torsional mode.

$$\begin{pmatrix} z \\ \theta_x \\ \theta_y \\ m_1 \end{pmatrix} = M_r \cdot inv(M) \cdot \begin{pmatrix} rz \\ r\theta_x \\ r\theta_y \\ rm_1 \end{pmatrix} = \begin{pmatrix} 1 & * & * & * \\ * & 1 & * & * \\ * & * & 1 & * \\ * & * & * & 1 \end{pmatrix} \cdot \begin{pmatrix} rz \\ r\theta_x \\ r\theta_y \\ rm_1 \end{pmatrix} = E' \cdot \begin{pmatrix} rz \\ r\theta_x \\ r\theta_y \\ rm_1 \end{pmatrix} \quad (3')$$

To prevent excitation of the torsional mode, inv(M) is to be calculated in association with Mr of the real apparatus. However, it is difficult to directly obtain the elements lxnr, lynr, and φnr of Mr of the real apparatus. Modal analysis is one of techniques for measuring φn of the real apparatus, with which vibration excited by an impact hammer is measured by an accelerometer. Although modal analysis enables checking of a rough deformation shape, it is difficult to measure φn with such accuracy that the result of measurement can be used for thrust distribution adjustment. Although it may be necessary to accurately obtain coordinate values of the center of gravity to calculate the elements lxn and lyn, measurement on the real apparatus having the stages implemented therein is difficult and therefore a dedicated measuring apparatus is to be prepared.

Therefore, it is not possible to accurately obtain Mr and then obtain inv(Mr) as an inverse matrix. For this reason, a response from the real apparatus is measured using inv(M) as an initial value, and each element of inv(M) is directly adjusted based on the result of measurement so that inv(M) approximates inv(Mr). Adjustment procedure will be described in detail below.

Figure 4A:
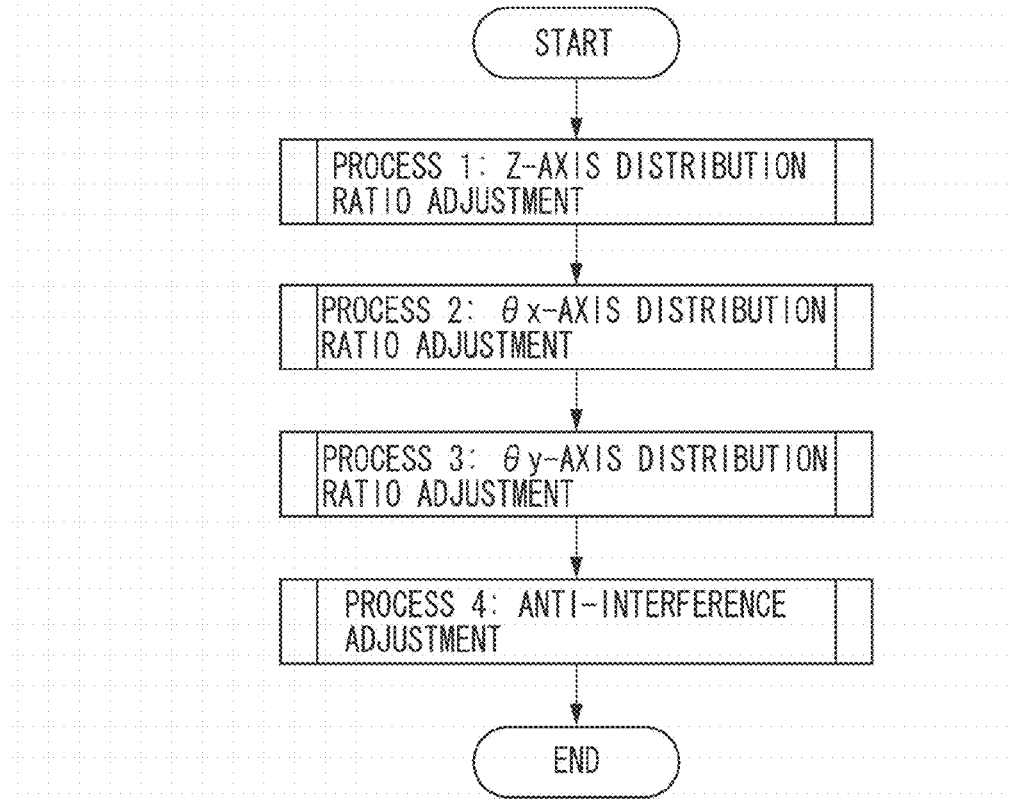
FIGS. 4A and 4B are flow charts illustrating processing for adjusting the thrust distribution ratio.
Figure 4B:
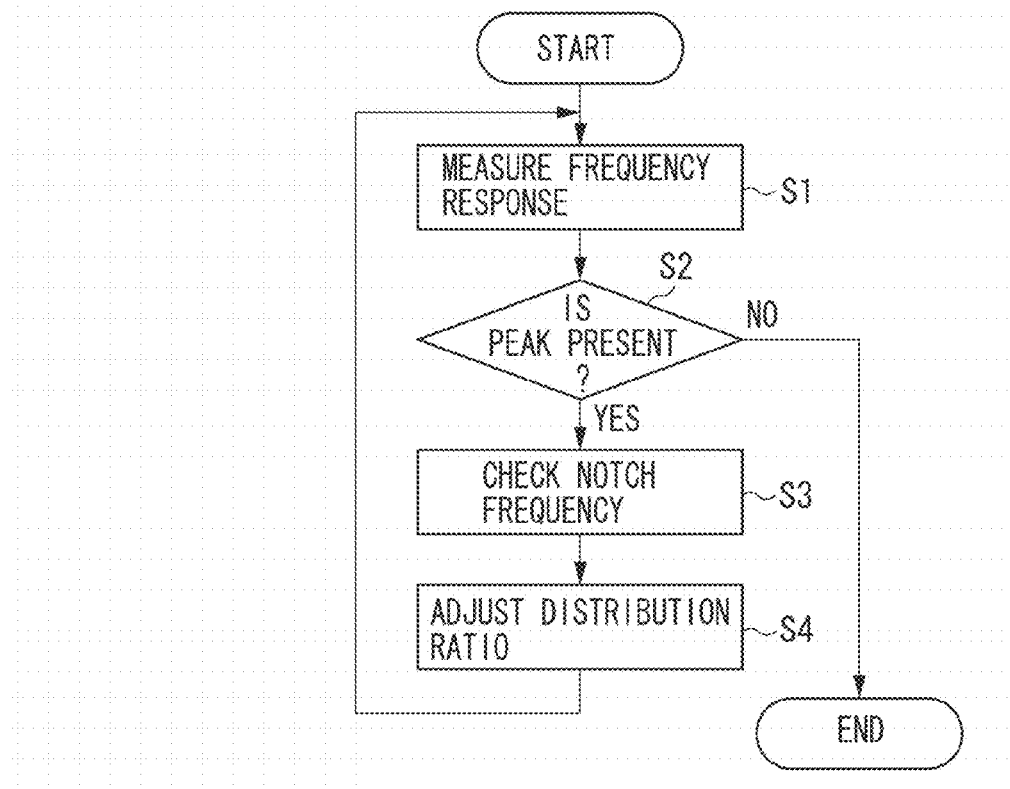

FIGS. 4A and 4B are flow charts illustrating processing for adjusting the thrust distribution ratio. The thrust distribution adjustment procedure includes four main processes 1 to 4 (FIG. 4A). A process 1 relates to distribution ratio adjustment corresponding to the Z-axis command input. A process 2 relates to distribution ratio adjustment corresponding to the θx-axis command input. A process 3 relates to distribution ratio adjustment corresponding to the θy-axis command input. A process 4 relates to anti-interference adjustment.

Steps in each process will be described below. Processing for distribution ratio adjustment corresponding to the Z-axis command input (the 1st column of inv(M)) in the process 1 will be described below (FIG. 4B).

In step S1, the control unit measures a frequency response of the Z axis. The frequency response measured in step S1 is a result of obtaining a Z-axis positional displacement produced by the Z and m1 outputs only with the rZ command input in formula (3'). Specifically, the measured frequency response includes the effect of the (1,1) and (4,1) elements of a matrix E' in formula (3'). Although the rigid-body Z-axis displacement and the deformation of the torsional mode m1 are separated in the mode coordinate system, both are included in the physically measured Z-axis displacement and its frequency response. Specifically, the above conditions are represented by formula (4.1).

$$\begin{pmatrix} z \\ \theta_x \\ \theta_y \\ m_1 \end{pmatrix} = E' \cdot \begin{pmatrix} rz \\ 0 \\ 0 \\ 0 \end{pmatrix} \quad (4.1)$$

$$= \begin{pmatrix} m_{(z_1/z)} + m_{(z_2/z)} + m_{(z_3/z)} + m_{(z_4/z)} & \cdots & \cdots & \cdots \\ \cdots & \cdots & \cdots & \cdots \\ \cdots & \cdots & \cdots & \cdots \\ m_{(z_1/z)} \cdot \phi_{1r} + m_{(z_2/z)} \cdot \phi_{2r} + m_{(z_3/z)} \cdot \phi_{3r} + m_{(z_4/z)} \cdot \phi_{4r} & \cdots & \cdots & \cdots \end{pmatrix} \cdot \begin{pmatrix} rz \\ 0 \\ 0 \\ 0 \end{pmatrix}$$

The frequency response to be obtained may be based on any of combinations: Z-axis positional displacement vs. Z-axis position target value, Z-axis positional displacement vs. Z-axis positional deviation, and Z-axis positional displacement vs. Z-axis force command in FIG. 2. The Z-axis positional deviation refers to a difference between the Z-axis position target value and the Z-axis positional displacement. The Z-axis force command input is the Z component of a signal output from the position control unit in FIG. 2. In either case, it is possible to check whether the resonance peak of the torsional mode is excited when the thrust distribution matrix is used. For example, Z-axis positional displacement/Z-axis position target value can be obtained during execution of position control by applying a random noise or a chirp sine signal to the Z-axis target position, measuring the Z-axis displacement, and performing FFT operation. Alternatively, it can be obtained from the amplitude and phase of the response after performing frequency sweep of a sine waveform.

In step S2, the control unit checks whether the frequency response has a peak at the resonance frequency of the torsional mode. An approximate value of the resonance frequency can be calculated by FEM simulation. When the torsional mode is excited, an exciting force is applied to the torsional mode to produce deformation corresponding to the rZ command input. This state is represented by a non-zero value of m1 in formula (4.1). Specifically, the (4,1) element of the matrix E' is not zero, as represented by formula (4.2).

$$m_{(z_1/z)} \cdot \phi_{1r} + m_{(z_2/z)} \cdot \phi_{2r} + m_{(z_3/z)} \cdot \phi_{3r} + m_{(z_4/z)} \cdot \phi_{4r} \neq 0 \quad (4.2)$$

When the torsional mode is excited, deformation of the torsional mode is maximized at the resonance frequency, resulting in a peak in the frequency response. Therefore, when the frequency response has a peak, the control unit performs distribution ratio adjustment in step S4 below. When the resonance frequency has a peak, the torsional mode is not excited and therefore thrust distribution adjustment is not required and is ended.

In step S3, the control unit checks whether a notch (anti-resonance) appears at a frequency lower than the peak or higher than it. This check enables recognizing whether the torsional mode deformation at the measurement position is excited in phase with the rigid-body Z-axis displacement (a notch appears at a frequency lower than the peak) or in reverse phase therewith (a notch appears at a frequency higher than the peak). It should be noted that, when the position of any measuring point changes, for example, after encoder changeover, the deformation to be measured changes in phase even in the same excitation state.

In step S4, the control unit adjusts the thrust distribution ratio for the Z actuators corresponding to the rZ command input. Specifically, referring to formula (2.1) having only the rZ input in formula (2), the control unit adjusts $m(z1/z)$, $m(z2/z)$, $m(z3/z)$, and $m(z4/z)$ in the 1st column which are rZ-related elements of inv(M).

$$\begin{pmatrix} z_1 \\ z_2 \\ z_3 \\ z_4 \end{pmatrix} = inv(M) \cdot \begin{pmatrix} rz \\ 0 \\ 0 \\ 0 \end{pmatrix} \quad (2.1)$$

$$= \begin{pmatrix} m_{(z_1/z)} & m_{(z_1/\theta_x)} & m_{(z_1/\theta_y)} & m_{(z_1/m_1)} \\ m_{(z_2/z)} & m_{(z_2/\theta_x)} & m_{(z_2/\theta_y)} & m_{(z_2/m_1)} \\ m_{(z_3/z)} & m_{(z_3/\theta_x)} & m_{(z_3/\theta_y)} & m_{(z_3/m_1)} \\ m_{(z_4/z)} & m_{(z_4/\theta_x)} & m_{(z_4/\theta_y)} & m_{(z_4/m_1)} \end{pmatrix} \cdot \begin{pmatrix} rz \\ 0 \\ 0 \\ 0 \end{pmatrix} = \begin{pmatrix} m_{(z_1/z)} \\ m_{(z_2/z)} \\ m_{(z_3/z)} \\ m_{(z_4/z)} \end{pmatrix} \cdot rz$$

Specifically, while forming two diagonal pairs of Z actuators in FIG. 1 (one diagonal pair of Z1 and Z3 and another diagonal pair of Z2 and Z4), the control unit increases the thrust distribution ratio for one diagonal pair and decreases the thrust distribution ratio for the other diagonal pair. For example, the control unit increases the absolute value of $m(z1/z)$ and $m(z3/z)$ of inv(M) and decreases the absolute value of $m(z2/z)$ and $m(z4/z)$ of inv(M). The control unit determines which pair's distribution ratio is to be increased depending on whether the excitation state is in phase or in reverse phase with the rigid-body Z-axis displacement. The control unit determines how much the distribution ratio is to be changed depending on the peak height.

Determination of actuator pairs will be described below. Since m1=0 is assigned in formula (4.1), the control unit performs this adjustment so that the (4,1) element of the matrix E' in formula (3') or formula (4.1) representing the effect of the Z-axis command input on the torsional mode becomes zero, i.e., formula (4.3) is satisfied.

$$m_{(z_1/z)} \cdot \phi_{1r} + m_{(z_2/z)} \cdot \phi_{2r} + m_{(z_3/z)} \cdot \phi_{3r} + m_{(z_4/z)} \cdot \phi_{4r} = 0 \quad (4.3)$$

To make this polynomial zero, it is necessary that the absolute value of the sum of terms having a positive value equals the absolute value of the sum of terms having a negative value. Specifically, to satisfy formula (4.3), two pairs of terms $m(Zn/Z)\phi nr$ having the same sign and adjust $m(Zn/Z)$ are formed so that the sum of terms of each pair has an equal absolute value. When driving the stage in the Z-axis direction, all the Z actuators generate driving force in the same direction. More specifically, the term $m(Zn/Z)$ (n=1 to 4) has the same sign. Since $\phi n$ representing the deformation shape has a different phase depending on the actuator position, the sign of $\phi 1r$ and $\phi 3r$ is different from the sign of $\phi 2r$ and $\phi 4r$. In this case, therefore, one pair of Z1 and Z3 and another pair of Z2 and Z4 are formed. In this case, adjustment can be made easier by uniformly adjusting $m(Zn/Z)$ by a common coefficient k by using $k*m(Z1/Z)$ and $k*m(Z3/Z)$ or $(1/k)*m(Z2/Z)$ and $(1/k)*m(Z4/Z)$ as values after adjustment, as represented by formula (4.4).

$$k|m_{(z_1/z)} \cdot \phi_{1r} + m_{(z_3/z)} \cdot \phi_{3r}| = \left(\frac{1}{k}\right)|m_{(z_2/z)} \cdot \phi_{2r} + m_{(z_4/z)} \cdot \phi_{4r}| \quad (4.4)$$

The term $m(Zn/Z)$ (n=1 to 4) can be adjusted separately. Although adjustment can also be performed by changing either one pair, this method is not desirable since the value of the (1,1) element of the matrix E' in formula (3'), i.e., the gain for the Z axis changes. Adjustment as represented by formula (4.4) can avoid the value of the (1,1) element of the matrix E' in formula (3').

Then, the processing returns to step S1. In step S1, the control unit measures a frequency response and repeats the above-mentioned adjustment until the peak is minimized.

The above processing enables determining the thrust distribution ratio not causing excitation of the torsional mode by the Z-axis command input. Since the thrust distribution ratio can be determined based on the peak height and a frequency relation between the peak and the notch, adjustment can be automated.

Processing for distribution ratio adjustment corresponding to the $\theta x$-axis command input (the 2nd column of inv(M)) in the process 2 will be described below. Since the basic procedure of the process 2 is similar to that of the process 1, only differences from the process 1 will be described below.

In step S1, the control unit measures a frequency response of the $\theta x$ axis. The frequency response measured in step S1 is a result of obtaining a $\theta x$-axis positional displacement produced by the $\theta x$ and m1 outputs only with the $r\theta x$ command input in formula (3').

In step S2, the control unit checks whether the torsional mode has a peak.

In step S3, the control unit checks whether the torsional mode deformation is excited in phase with the rigid-body $\theta x$-axis displacement (a notch appears at a frequency lower than the peak) or in reverse phase therewith (a notch appears at a frequency higher than the peak) based on a frequency relation between the peak and the notch.

In step S4, the control unit adjusts the thrust distribution ratio for the Z actuators corresponding to the $r\theta x$ command input (the 2nd column of inv(M)). Specifically, the control unit increases the thrust distribution ratio for one pair of Z1 and Z4 (two Z actuators to the right of a center line in parallel with the Y axis of the tabletop 1 in FIG. 1A) and decreases the thrust distribution ratio for the other pair of Z2 and Z3 (two Z actuators to the left of a center line in parallel with the Y axis of the tabletop 1). For example, the control unit increases the absolute value of $m(z1/\theta x)$ and $m(z4/\theta x)$ of inv(M) and decreases the absolute value of $m(z2/\theta x)$ and $m(z3/\theta x)$ of inv(M). The control unit determines which pair's distribution ratio is to be increased depending on whether the excitation state is in phase or in reverse phase with the rigid-body $\theta x$-axis displacement. The control unit determines how much the distribution ratio is to be changed depending on the peak height.

Determination of actuator pairs will be described below. The control unit performs this adjustment so that the (4,2) element of the matrix E' in formula (3') representing the effect of the $\theta x$-axis command input on the torsional mode becomes zero, i.e., formula (5) is satisfied.

$$m_{(z_1/\theta_x)} \cdot \phi_{1r} + m_{(z_2/\theta_x)} \cdot \phi_{2r} + m_{(z_3/\theta_x)} \cdot \phi_{3r} + m_{(z_4/\theta_x)} \cdot \phi_{4r} = 0 \quad (5)$$

To satisfy formula (5), two pairs of terms m(Zn/θx)φnr having the same sign are formed and m(Zn/θx) is adjusted. When driving the stage in the θx-axis direction, the actuators generate driving force with inverted signs on the Y-axis positive and negative sides which are separated by the X axis. Specifically, the sign of m(Z1/θx) and m(Z2/θx) is different from the sign of m(Z3/θx) and m(Z4/θx). Since φ representing the deformation shape has a different phase depending on the actuator position, the sign of φ1r and φ3r is different from the sign of φ2r and φ4r. In this case, therefore, one pair of Z1 and Z4 and another pair of Z2 and Z3 are formed.

Then, the processing returns to step S1. In step S1, the control unit measures a frequency response and repeats the distribution ratio adjustment until the peak is minimized.

The above processing enables determining the thrust distribution ratio not causing excitation of the torsional mode by the θx-axis command input.

Processing for distribution ratio adjustment corresponding to the θy-axis command input (the 3rd column of inv(M)) in the process 3 will be described below. Since the basic procedure of the process 3 is similar to that of the process 1, only differences from the process 1 will be described below.

In step S1, the control unit measures a frequency response of the θy axis. The frequency response measured in step S1 obtains a θy-axis positional displacement produced by the θy and m1 outputs only with the rθy command input in formula (3').

In step S2, the control unit checks whether the torsional mode has a peak.

In step S3, the control unit checks whether the torsional mode deformation is excited in phase with the rigid-body θy-axis displacement (a notch appears at a frequency lower than the peak) or in reverse phase therewith (a notch appears at a frequency higher than the peak) based on a frequency relation between the peak and the notch.

In step S4, the control unit adjusts the thrust distribution ratio for the Z actuators corresponding to the rθy command input (the 3rd column of inv(M)). Specifically, the control unit increases the thrust distribution ratio for one pair of Z1 and Z2 (two Z actuators to the bottom of a center line in parallel with the X axis of the tabletop 1 in FIG. 1A) and decreases the thrust distribution ratio for the other pair of Z3 and Z4 (two Z actuators to the top of a center line in parallel with the X axis of the tabletop 1). For example, the control unit increases the absolute value of m(z1/θy) and m(z2/θy) of inv(M) and decreases the absolute value of m(z3/θy) and m(z4/θy) of inv(M). The control unit determines which pair's distribution ratio is to be increased depending on whether the excitation state is in phase or in reverse phase with the rigid-body θy-axis displacement. The control unit determines how much the distribution ratio is to be changed depending on the peak height.

Determination of actuator pairs will be described below. The control unit performs this adjustment so that the (4,3) element of the matrix E' in formula (3') representing the effect of the θy-axis command input on the torsional mode becomes zero, i.e., formula (6) is satisfied.

$$m_{(z_1/\theta_y)} \cdot \phi_{1r} + m_{(z_2/\theta_y)} \cdot \phi_{2r} + m_{(z_3/\theta_y)} \cdot \phi_{3r} + m_{(z_4/\theta_y)} \cdot \phi_{4r} = 0 \quad (6)$$

When driving the stage in the θy-axis direction, the actuators generate driving force with inverted signs on the X-axis positive and negative sides which are separated by the Y axis. Specifically, the sign of m(Z1/θy) and m(Z4/θy) is different from the sign of m(Z2/θy) and m(Z3/θy). Since φ representing the deformation shape has a different phase, the sign of φ1r and φ3r is different from the sign of φ2r and φ4r. To satisfy formula (6), two pairs of terms m(Zn/θy)φnr having the same sign are formed and m(Zn/θy) is adjusted. In this case, therefore, one pair of Z1 and Z2 and another pair of Z3 and Z4 are formed.

Then, the processing returns to step S1. In step S1, the control unit measures a frequency response and repeats the distribution ratio adjustment until the peak is minimized.

The above processing enables determining the thrust distribution ratio not causing excitation of the torsional mode by the θy-axis command input.

The above-mentioned processes enable thrust distribution adjustment so that the Z-, θx-, and θy-axis command inputs do not cause excitation of the torsional mode. In this state, each coefficient of inv(M) in formula (3') is adjusted so that non-main diagonal elements in the 4th row become zero as represented by formula (7). Since a command for each axis does not cause excitation of the torsional mode, it is guaranteed that the torsional mode is not excited even if commands are simultaneously given to all axes as a linear sum of these command inputs. Since the processes 1, 2, and 3 do not affect each other, they can be performed in any desired order.

$$\begin{pmatrix} z \\ \theta_x \\ \theta_y \\ m_1 \end{pmatrix} = M_r \cdot inv(M) \cdot \begin{pmatrix} rz \\ r\theta_x \\ r\theta_y \\ rm_1 \end{pmatrix} = \begin{pmatrix} 1 & * & * & * \\ * & 1 & * & * \\ * & * & 1 & * \\ 0 & 0 & 0 & 1 \end{pmatrix} \cdot \begin{pmatrix} rz \\ r\theta_x \\ r\theta_y \\ rm_1 \end{pmatrix} \quad (7)$$

Processing for anti-interference adjustment in the process 4 will be described below. Although the above-mentioned procedures can obtain the thrust distribution ratio not causing excitation of the torsional mode, interference between the Z, θx, and θy axes may change depending on thrust distribution adjustment. Specifically, in formula (7), non-main diagonal elements in other than the 4th row are not necessarily become zero. Therefore, when the Z axis is driven, for example, there may be a situation that the θx axis is driven together. To prevent this interference, an anti-interference matrix D is introduced. The initial value of the matrix D is a unit matrix.

$$\begin{pmatrix} z_1 \\ z_2 \\ z_3 \\ z_4 \end{pmatrix} = inv(M) \cdot D \cdot \begin{pmatrix} rz \\ r\theta_x \\ r\theta_y \\ rm_1 \end{pmatrix} \quad (8)$$

The matrix D will be described in detail below. The main diagonal elements are all one. Each of non-main diagonal elements denotes the thrust distribution ratio for other axes (axes other than a relevant axis) corresponding to a drive command for the relevant axis.

$$\begin{pmatrix} rz \\ r\theta_x \\ r\theta_y \\ rm_1 \end{pmatrix} = \begin{pmatrix} 1 & d_{z/\theta_x} & d_{z/\theta_y} & 0 \\ d_{\theta_x/z} & 1 & d_{\theta_x/\theta_y} & 0 \\ d_{\theta_y/z} & d_{\theta_y/\theta_x} & 1 & 0 \\ 0 & 0 & 0 & 1 \end{pmatrix} \begin{pmatrix} rz \\ r\theta_x \\ r\theta_y \\ rm_1 \end{pmatrix} \quad (9)$$

For example, when the Z axis is driven and the θx axis is driven together, a command for negating the driving force can be generated for the θx axis by setting a certain value to an element d(θx/Z) of the matrix D. Specifically, when the control unit gives a positive-direction step drive command to the Z-axis and a positive-direction transient displacement is generated in the θx-axis direction, a negative value is set as the element d(θx/Z). It is also possible to measure a frequency response of the θx-axis displacement corresponding to the Z-axis command input and perform the distribution ratio adjustment so that the gain is minimized.

The above adjustment also applies to other non-main diagonal elements.

This process is to be performed after all of the processes 1, 2, and 3 are completed. The anti-interference matrix D only redistributes the Z-, θx-, and θy-axis command inputs. Therefore, when adjustment is made so that a command for each axis does not cause excitation of the torsional mode in the processes 1, 2, and 3 (i.e., in a state of formula (7)), it is guaranteed that the torsional mode is not exited regardless of the adjustment of the anti-interference matrix D. So far, adjustment is made so that the product of the matrices Mr, inv(M), and D produces a unit matrix except the 4th column (formula (10)). Therefore, the Z-, θx-, and θy-axis command inputs do not cause excitation of the torsional mode and each axis can be independently driven.

$$\begin{pmatrix} z \\ \theta_x \\ \theta_y \\ m_1 \end{pmatrix} = M_r \cdot inv(M) \cdot D \cdot \begin{pmatrix} rz \\ r\theta_x \\ r\theta_y \\ rm_1 \end{pmatrix} = \begin{pmatrix} 1 & 0 & 0 & * \\ 0 & 1 & 0 & * \\ 0 & 0 & 1 & * \\ 0 & 0 & 0 & 1 \end{pmatrix} \cdot \begin{pmatrix} rz \\ r\theta_x \\ r\theta_y \\ rm_1 \end{pmatrix} \quad (10)$$

Since the rm1 input is constantly zero, rm1-related elements can be omitted. Eventually, therefore, the obtained product of the matrices inv(M) and D can be used as a 4-by-3 thrust distribution matrix.

With the present adjustment procedure, a measured value and a parameter to be adjusted are predetermined on a one-to-one basis in each process, and back tracking between processes is not required, thus achieving efficient adjustment. Further, adjustment processes can be easily automated. No dedicated measuring apparatus is required for parameter measurement. It is only necessary to prepare a frequency response measurement function and an adjustment function on the real apparatus. Therefore, readjustment can be performed on the real apparatus in a short time during calibration process or maintenance. As long as there arises no performance issue, some of the processes 1, 2, 3, and 4 can be omitted. For example, when it is not necessary to adjust the thrust distribution ratio for θx, the process 2 can be omitted.

Exemplary adjustment in the process 1 (adjustment of the distribution ratio corresponding to the Z-axis command input (the 1st column of inv(M))) will be described in detail below with reference to FIG. 5. Suppose that the Z-axis displacement is measured by the encoders E1, E2, and E4, and is, by coordinate conversion, converted to the Z-axis displacement at the center of the tabletop 1. In this case, when the encoders are arranged at equal intervals, the Z-axis displacement approximately equals (E2+E4)/2 to which the encoder E1 hardly contributes.

Figure 5A:
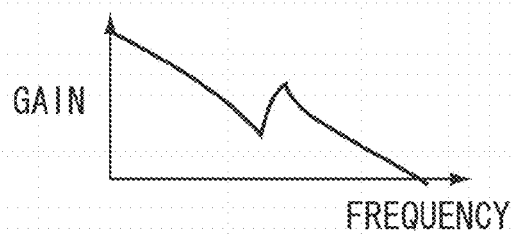
FIGS. 5A, 5B, and 5C illustrate exemplary thrust distribution adjustments.

In step S1, the control unit measures a frequency response of the Z-axis displacement. FIG. 5A illustrates gain characteristics of the frequency response (open-loop frequency response) of the Z-axis positional displacement/positional deviation obtained in step S1. As long as a peak can be determined, a closed-loop frequency response can be used.

In step S2, the control unit checks a resonance peak of the torsional mode. In this example, the torsional mode has a peak and therefore adjustment is to be performed.

Figure 5B:
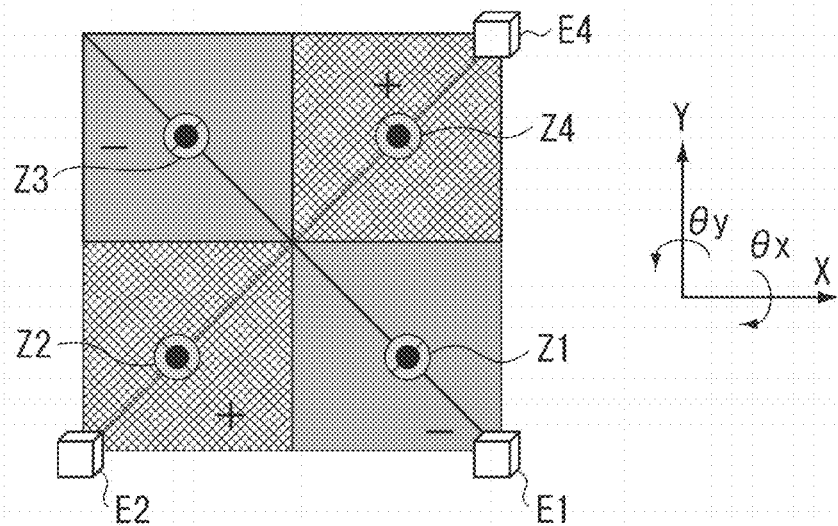

In step S3, the control unit checks a frequency relation between the peak and the notch. In this example, the notch and peak appear in this order from lower to higher frequencies, denoting that the measured torsional mode is in phase with the rigid-body Z-axis displacement. This fact denotes that, when the Z actuators are driven in the Z-axis positive direction, the torsional mode is displaced in the positive direction at measuring points (positions of the encoders E2 and E4) (FIG. 5B). On the contrary, the torsional mode is displaced in the negative direction (in reverse phase) at the position of the encoder E1. It should be noted that, when the position of any measuring point changes, for example, after encoder changeover, the deformation to be measured changes in phase even in the same deformation state.

In step S4, the control unit changes thrust distribution to the Z actuators in consideration of the phase relation. When driving the Z actuators in the Z-axis positive direction, the control units gives the positive command to all the Z actuators. In this case, when the actuators Z2 and Z4 in the encoder E2 and E4 areas, respectively, have a relatively strong thrust generation force and the actuators Z1 and Z3 have a relatively weak thrust generation force, the torsional mode is displaced in phase with the rigid-body Z-axis displacement. In this case, deformation of the torsional mode can be prevented by reducing the thrust distribution ratio for one diagonal pair of Z2 and Z4 and increasing the thrust distribution ratio for the other diagonal pair of Z1 and Z3. Specifically, the control unit increases the absolute value of m(z1/z) and m(z3/z) of inv(M) and decreases the absolute value of m(z2/z) and m(z4/z) of inv(M).

Figure 5C:
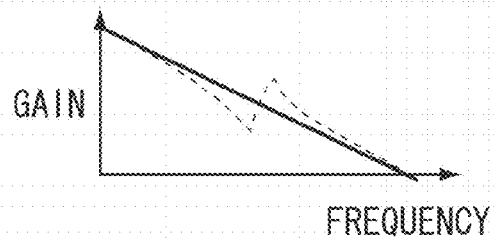

Then, the control unit measures a frequency response again and repeats the distribution ratio adjustment until a peak is no longer detected as illustrated by the solid line in FIG. 5C or until a measured value falls below a permissible value.

Adjustment for the θx and θy axes can also be performed in a similar way, but with a different combination of the Z actuators subjected to distribution adjustment.

Even when more than four Z actuators are used, adjustment can be performed in a similar way by equivalently recognizing them as four actuators. More specifically, when a limitation is applied such that the same thrust is distributed to two actuators in one area surrounded by nodes of the torsional mode, the middle point between the two actuators can be equivalently regarded as one actuator. For example, when five actuators are arranged as illustrated in FIG. 6, the actuators Z4 and Z5 in the same area is virtually recognized as an actuator Z4' arranged therebetween, and the control unit performs the distribution ratio adjustment for the four actuators, Z1, Z2, Z3, and Z4'. This means that the thrust distribution ratio assigned to the actuator Z4' is actually distributed on halves to the actuators Z4 and Z5.

The tabletop 1 is not limited to a flat plate having an approximate square shape as long as the torsional mode deformation is produced.

Although distribution adjustment has specifically been described based on the torsional mode, the descriptions also apply to any other deformation modes. Specifically, since the combination of the four actuators achieves four degrees of freedom, one degree of freedom can be used to any one desired deformation mode in addition to three degrees of freedom (Z, θx, θy) of the rigid body displacement. The same adjustment procedure as the above-mentioned one can be used by replacing the values of m1 and φn with the values for a target mode in formula (1). However, actuator pairs to be adjusted will be determined depending on the phase of each φn at the time of adjustment.

As described above, adjusting the thrust distribution ratio based on the frequency response characteristics measured on a real apparatus enables determining the thrust distribution ratio causing neither excitation of the torsional mode nor interference between axes by the Z-, θx-, and θy-axis command inputs, even if there is a design or manufacture error. Therefore, decreasing the eigenvalue of the torsional mode does not cause degradation in control performance, thus enabling weight reduction of the stages and improvement in throughput.

Figure 7A:
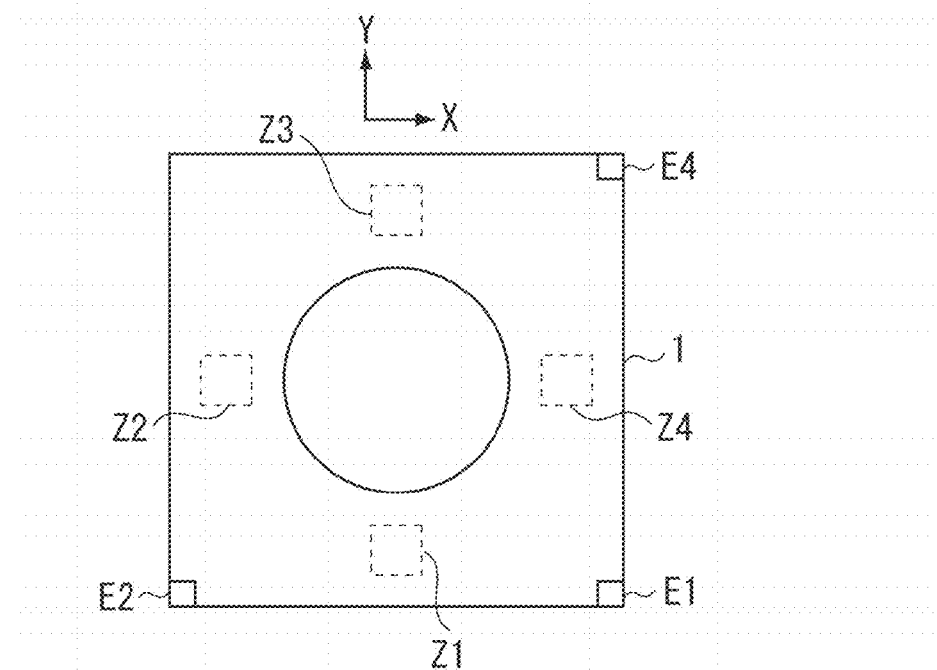
FIGS. 7A and 7B illustrate an overall configuration of a stage according to a second exemplary embodiment.
Figure 7B:
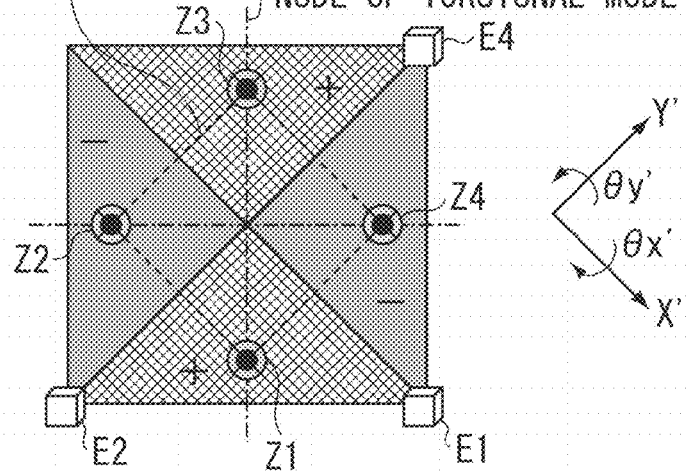

FIG. 7 illustrates an overall configuration of a tabletop 1 according to a second exemplary embodiment. The present exemplary embodiment differs from the first exemplary embodiment in that the actuators are arranged in lozenge form on the tabletop 1. Each of the four actuators is arranged in each of four areas surrounded by nodes of the bending mode. Excitation of the bending mode can be prevented by appropriately distributing the thrust by using a thrust distribution matrix. Further, excitation of the torsional and curvature modes can be prevented by arranging the actuators on intersections of the nodes of the torsional mode and curvature mode.

The thrust distribution matrix in this case can be determined, in a similar way to that in the first exemplary embodiment, based on formula (1') in which the torsional mode m1 in formula (1) is replaced with the bending mode m3. In formula (1'), φn (n=1 to 4) is a modal parameter for the bending mode.

$$\begin{pmatrix} z \\ \theta_x \\ \theta_y \\ m_3 \end{pmatrix} = \begin{pmatrix} 1 & 1 & 1 & 1 \\ l_{y1} & l_{y1} & l_{y3} & l_{y4} \\ l_{x1} & l_{x2} & l_{x3} & l_{x4} \\ \phi_1 & \phi_2 & \phi_3 & \phi_4 \end{pmatrix} \cdot \begin{pmatrix} z_1 \\ z_2 \\ z_3 \\ z_4 \end{pmatrix} = M \cdot \begin{pmatrix} z_1 \\ z_2 \\ z_3 \\ z_4 \end{pmatrix} \quad (1')$$

The bend mode differs from the torsional mode in the combination of actuators subjected to distribution adjustment.

When driving the stage in the Z-axis direction, since the driving force of all the Z actuators has the same sign, the bending mode can be adjusted by adjusting each of the diagonal pairs (a pair of Z1 and Z3 and a pair of Z2 and Z4) having the same phase of bending mode deformation. When driving the stage in the θx-axis direction, the actuators Z2 and Z4 hardly contribute to drive since they are almost on the θx axis. To rotate the stage around the X axis, the actuators generate driving force with inverted signs on the Y-axis positive and negative sides which are separated by the X axis. Therefore, in adjustment in the θx-axis direction, taking into account the effect on the bending mode in consideration of the sign of driving force, the thrust distribution ratio for one side (the actuator Z1) is to be increased and the thrust distribution ratio for the other side (the actuator Z3) is to be decreased, the two sides being separated by the X axis. Likewise, in adjustment in the θy direction, the thrust distribution ratio for one side (the actuator Z2) is to be increased and the thrust distribution ratio for the other side (the actuator Z4) is to be decreased, the two sides being separated by the Y axis.

Further, in the second exemplary embodiment, actuator arrangement is rotated by 45 degrees from that in the first exemplary embodiment. Therefore, when X', Y', θx', and θy' coordinate axes are defined by rotating the X, Y, θx, and θy coordinate axes by 45 degrees, the relation between the coordinate axes, the actuator arrangements, and the phase of bending mode deformation in the first exemplary embodiment also apply to the second exemplary embodiment. Therefore, when measurement of frequency response is performed for the Z, θx', and θy' axes, the adjustment processes and the combination of actuator pairs at the time of adjustment in the first exemplary embodiment are also applicable to the second exemplary embodiment.

As mentioned above, similar to the torsional mode, the thrust distribution ratio for the bending mode can also be adjusted based on the frequency response characteristics measured on the real apparatus. Thus, even a case where the actuators are arranged at antinode positions of the bending mode because of design restrictions does not cause degradation in control performance, thus enabling weight reduction of the stages and improvement in throughput.

Figure 8A:
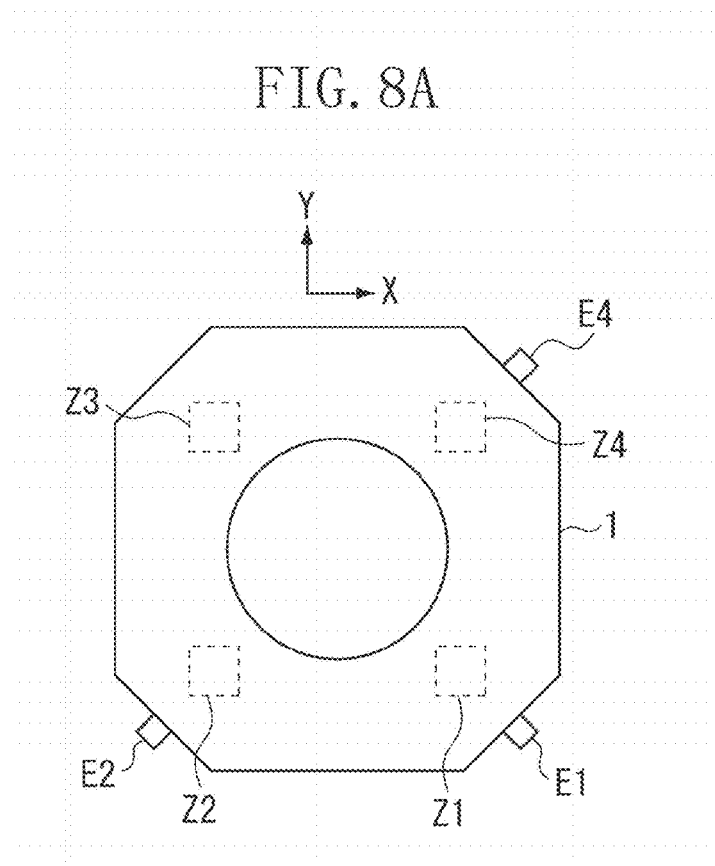
FIGS. 8A and 8B illustrate variations of the shape of a stage tabletop according to a third exemplary embodiment.
Figure 8B:
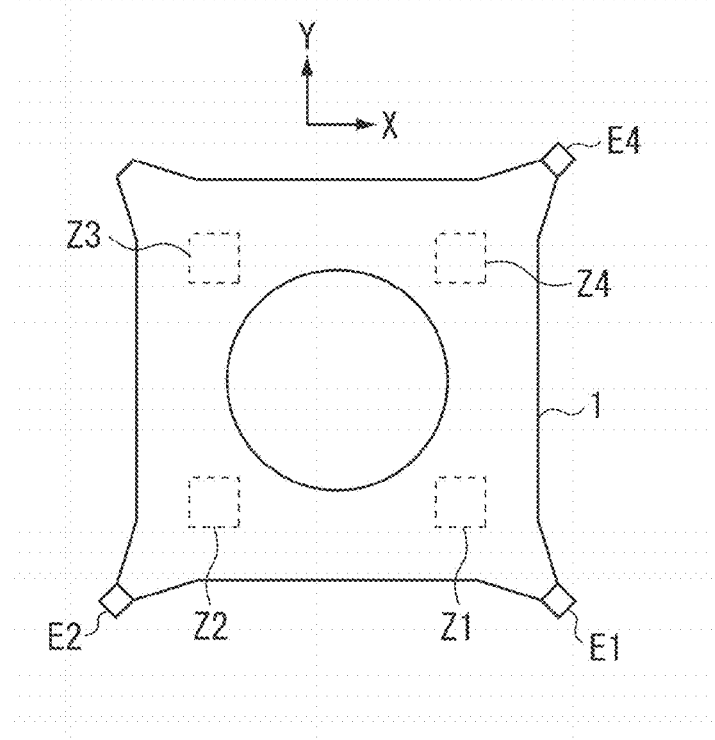

FIGS. 8A and 8B illustrate variations of the shape of a stage tabletop 1 according to a third exemplary embodiment.

FIG. 8A illustrates a square tabletop having four cut corners, i.e., an approximate octagonal shape. This shape enables a higher resonance frequency of the tabletop than the square shape in the first exemplary embodiment.

FIG. 8B illustrates a square tabletop having four protruded corners. This shape enables a long interval between encoders while minimizing a weight increase of the tabletop. Therefore, in the case of encoder measurement, the measurement resolution in inclination directions (θx and θy axes) can be improved.

Even with such shapes, the torsional mode and bending mode will occur at low frequencies. Therefore, adjusting the thrust distribution matrix to prevent these modes can prevent degradation in control performance and reduce the stage weight, thus improving the throughput. The shape of stage tabletop is not limited to the above-mentioned shapes. The adjustment methods according to the present invention are also applicable to any other flat shapes.

FIG. 9 illustrates an overall configuration of an exposure apparatus 10 according to a fourth exemplary embodiment of the present invention.

As illustrated in FIG. 9, the exposure apparatus 10 includes an illumination apparatus 7, a reticle stage 6 on which a reticle is placed, a projection optical system 5, and a wafer stage 4 on which a wafer is placed. The exposure apparatus 10 projects a circuit pattern formed on the reticle onto the wafer based either on the step and repeat projection exposure method or the step and scan projection exposure method.

The illumination apparatus 7 illuminates the reticle on which a circuit pattern is formed. The illumination apparatus 7 includes a light source unit and an illumination optical system. The light source unit uses, for example, a laser light source. Usable laser types include ArF excimer laser with a wavelength of about 193 nm, KrF excimer laser with a wavelength of about 248 nm, F2 excimer laser with a wavelength of about 157 nm, and so on. However, usable laser types are not limited to excimer laser but maybe, for example, YAG laser. Further, the number of laser devices is not limited, either. When a laser light source is used, a light flux shaping optical system for shaping a parallel light flux from the laser light source into a light beam having a desired shape is also used, and an incoherentizing optical system for incoherentizing a coherent laser light flux. Further, light sources usable for the light source unit are not limited to laser but may be one or a plurality of mercury or xenon lamps.

The illumination optical system, which is an optical system for illuminating a mask, includes a lens, a mirror, a light integrator, and a diaphragm.

The projection optical system 5 may be an optical system including only a plurality of lens elements, an optical system (a catadioptric optical system) including a plurality of lens elements and at least one concave mirror, an optical system including a plurality of lens elements and at least one diffraction optical element such as a kinoform, or a full-mirror type optical system.

The reticle stage 6 and the wafer stage 4 are moved by an actuator. In the case of the step and scan projection exposure method, these two stages move in synchronization with each other. At least either of the wafer stage 4 and the reticle stage 6 is separately provided with an actuator to position a reticle pattern onto the wafer.

The wafer stage 4 includes a wafer stage tabletop 1 and a coarse motion stage 2 movable in the X and Y directions. The wafer stage tabletop 1 is mounted on the coarse motion stage 2. The coarse motion stage 2 is installed on a support member 3. FIG. 9 illustrates an exemplary actuator composed of movers 8 and stators 9 as a coarse motion stage drive unit. However, the drive unit is not limited thereto but may be a planar motor composed of the bottom plate of the coarse motion stage 2 and the top plate of the support member 3. The planar motor is not limited to a particular configuration but may be a well-known planar motor.

The wafer stage tabletop 1 can be configured in a similar way to that in the first exemplary embodiment and therefore the effect of the torsional elastic vibration mode can be eliminated. Accordingly, weight reduction while maintaining high control performance is possible, thus achieving both high precision and high throughput. The reticle stage 6 can also be configured in a similar way to that in the first exemplary embodiment, thus achieving high precision and high throughput.

A control apparatus 11 controls operations of the entire exposure apparatus 10. A plurality of number of control apparatuses 11 may be assigned the relevant roles. The control apparatus 11 may control the adjustments described in the first to third exemplary embodiments. However, when a stage is provided with a control apparatus, the control apparatus may perform the adjustments.

A device (a semiconductor integrated circuit element, a liquid crystal display element, etc.) is manufactured through a process for exposing to light a substrate (a wafer, a glass substrate, etc.) with a photosensitive agent applied thereon, a process for developing the substrate, and other known processes by using the exposure apparatus according the fourth exemplary embodiment.

Other Embodiments

Aspects of the present invention can also be realized by a computer of a system or apparatus (or devices such as a CPU or MPU) that reads out and executes a program recorded on a memory device to perform the functions of the above-described embodiment(s), and by a method, the steps of which are performed by a computer of a system or apparatus by, for example, reading out and executing a program recorded on a memory device to perform the functions of the above-described embodiment(s). For this purpose, the program is provided to the computer for example via a network or from a recording medium of various types serving as the memory device (e.g., computer-readable medium).

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-001197 filed Jan. 6, 2010, which is hereby incorporated by reference herein in its entirety.

What is claimed is:

1. An apparatus comprising:
a tabletop having a plane;
a plurality of actuators configured to be driven in a direction perpendicular to the plane to move the tabletop; and
a control unit configured to measure a frequency response of the tabletop and, when a peak is detected at a resonance frequency of elastic vibration of the tabletop, adjust a thrust distribution ratio for the plurality of actuators to reduce the peak.

2. The apparatus according to claim 1, wherein at least one actuator is arranged at each antinode portion of the elastic vibration generated on the tabletop in each of a plurality of areas formed by nodes of the elastic vibration.

3. The apparatus according to claim 2, wherein the control unit decreases the thrust distribution ratio for an actuator arranged in an area out of the plurality of areas, where the tabletop moves in phase with a displacement of the elastic vibration; and increases the thrust distribution ratio for an actuator arranged in an area out of the plurality of areas, where the tabletop moves in reverse phase with the displacement.

4. The apparatus according to claim 2, wherein the plurality of areas are four areas separated by the nodes generated on the tabletop, the nodes extending in first and second directions and intersecting with each other.

5. The apparatus according to claim 4, wherein the elastic vibration generated on the tabletop is one of torsional vibration and bending vibration.

6. The apparatus according to claim 4, wherein the control unit vibrates target positions on the tabletop in a direction perpendicular to the plane; and
increases the thrust distribution ratio for one pair of the actuators arranged in two diagonal areas out of the four areas, and decreases the thrust distribution ratio for the other pair of the actuators arranged in another two diagonal areas out of the four areas.

7. The apparatus according to claim 4, wherein the control unit vibrates target positions on the tabletop in a direction around an axis extending in the first direction; and increases the thrust distribution ratio for one pair of the actuators arranged in one side, and decreases the thrust distribution ratio for the other pair of the actuators arranged in the other side, the two sides being separated by an axis extending in the second direction.

8. The apparatus according to claim 4, wherein the control unit vibrates target positions on the tabletop in a direction around an axis extending in the second direction; and increases the thrust distribution ratio for one pair of the actuators arranged in one side and decreases the thrust distribution ratio for the other pair of the actuators arranged in the other side, the two sides being separated by an axis extending in the first direction.

9. The apparatus according to claim 8, wherein the control unit obtains the thrust distribution ratio for the actuators used in positioning the tabletop in a direction perpendicular to the plane, in a direction around the axis extending in the first direction, and in the direction around the axis extending in the second direction; and then obtains the thrust distribution ratio corresponding to a drive command for each direction to avoid interference between movements of the tabletop in the direction perpendicular to the plane, in the direction around the axis extending in the first direction, and in the direction around the axis extending in the second direction.

10. The apparatus according to claim 1, wherein the tabletop has an approximately square shape.

11. An exposure apparatus including the apparatus according to claim 1.

12. A method, in an apparatus comprising a tabletop having a plane, and a plurality of actuators configured to be driven in a direction perpendicular to the plane to move the tabletop, for adjusting a thrust distribution ratio for the plurality of actuators, the method comprising:
  measuring a frequency response of the tabletop;
  confirming whether a peak is detected at a resonance frequency of elastic vibration of the tabletop in a measurement; and
  adjusting, when the peak is detected, the thrust distribution ratio to reduce the peak.

13. The method according to claim 12, further comprising arranging at least one actuator at each antinode portion of the elastic vibration generated on the tabletop in each of a plurality of areas formed by nodes of the elastic vibration.

14. The method according to claim 13, further comprising:
  decreasing the thrust distribution ratio for an actuator arranged in an area out of the plurality of areas, where the tabletop moves in phase with a displacement of the elastic vibration; and
  increasing the thrust distribution ratio for an actuator arranged in an area out of the plurality of areas, where the tabletop moves in reverse phase with the displacement.

15. The method according to claim 13, wherein the plurality of areas are four areas separated by the nodes generated on the tabletop, the nodes extending in first and second directions and intersecting with each other.

16. The method according to claim 15, wherein the elastic vibration generated on the tabletop is one of torsional vibration and bending vibration.

17. The method according to claim 15, further comprises:
  vibrating target positions on the tabletop in a direction perpendicular to the plane; and
  increasing the thrust distribution ratio for one pair of the actuators arranged in two diagonal areas out of the four areas, and decreasing the thrust distribution ratio for the other pair of the actuators arranged in another two diagonal areas out of the four areas.

18. The method according to claim 15, further comprises:
  vibrating target positions on the tabletop in a direction around an axis extending in the first direction; and
  increasing the thrust distribution ratio for one pair of the actuators arranged in one side, and decreasing the thrust distribution ratio for the other pair of the actuators arranged in the other side, the two sides being separated by an axis extending in the second direction.

19. The method according to claim 15, further comprises:
  vibrating target positions on the tabletop in a direction around an axis extending in the second direction; and
  increasing the thrust distribution ratio for one pair of the actuators arranged in one side and decreasing the thrust distribution ratio for the other pair of the actuators arranged in the other side, the two sides being separated by an axis extending in the first direction.

20. A device manufacturing method comprising:
  exposing a substrate to light by using the exposure apparatus according to claim 13; and
  developing the substrate exposed to light.

* * * * *